United States Patent
Katti

(10) Patent No.: US 8,525,602 B2
(45) Date of Patent: Sep. 3, 2013

(54) MAGNETIC DEVICE WITH WEAKLY EXCHANGE COUPLED ANTIFERROMAGNETIC LAYER

(75) Inventor: Romney R. Katti, Shorewood, MN (US)

(73) Assignee: Honeywell International Inc., Morristown, NJ (US)

( * ) Notice: Subject to any disclaimer, the term of this patent is extended or adjusted under 35 U.S.C. 154(b) by 53 days.

(21) Appl. No.: 13/070,249

(22) Filed: Mar. 23, 2011

(65) Prior Publication Data
US 2012/0242416 A1 Sep. 27, 2012

(51) Int. Cl.
*H01S 1/06* (2006.01)

(52) U.S. Cl.
USPC ........ 331/94.1; 360/324; 360/324.1; 257/295

(58) Field of Classification Search
USPC .............. 331/94.1; 360/324, 324.1; 257/295
See application file for complete search history.

(56) References Cited

U.S. PATENT DOCUMENTS

| | | | |
|---|---|---|---|
| 6,542,341 B1* | 4/2003 | Carey et al. .................. | 360/324 |
| 7,035,062 B1 | 4/2006 | Mao et al. | |
| 7,053,430 B2* | 5/2006 | Katti ............................ | 257/295 |
| 7,556,870 B2 | 7/2009 | Do et al. | |
| 7,616,412 B2 | 11/2009 | Zhu et al. | |
| 7,782,576 B2 | 8/2010 | Uesugi et al. | |
| 2003/0062975 A1 | 4/2003 | Kishi et al. | |
| 2003/0072110 A1* | 4/2003 | Dee .......................... | 360/324.12 |
| 2005/0157544 A1 | 7/2005 | Min et al. | |
| 2006/0077707 A1 | 4/2006 | Deak | |
| 2007/0176251 A1 | 8/2007 | Oh et al. | |
| 2007/0258281 A1 | 11/2007 | Ito et al. | |
| 2007/0285184 A1 | 12/2007 | Eyckmans et al. | |
| 2008/0037179 A1 | 2/2008 | Ito et al. | |
| 2008/0129401 A1 | 6/2008 | Fukuzawa et al. | |
| 2009/0230379 A1* | 9/2009 | Klostermann et al. ........... | 257/5 |
| 2010/0034017 A1 | 2/2010 | Rivkin et al. | |
| 2010/0072524 A1 | 3/2010 | Huai et al. | |
| 2010/0135068 A1 | 6/2010 | Ikarashi et al. | |
| 2010/0328799 A1* | 12/2010 | Braganca et al. ............... | 360/31 |
| 2011/0007431 A1 | 1/2011 | Braganca et al. | |

FOREIGN PATENT DOCUMENTS

| | | |
|---|---|---|
| GB | 2 400 720 A | 10/2004 |
| WO | 2005064783 A2 | 7/2005 |

OTHER PUBLICATIONS

Ralph et al., "Spin Transfer Torques," Journal of Magnetism and Magnetic Materials, 27 pages, 2008.
Wang et al., "Bias and Angular Dependence of Spin-Transfer Torque in Magnetic Tunnel Junctions," The American Physical Society, 10 pages, 2009.
Zhou et al., "Zero-Field Precession and Hysteretic Threshold Currents in a Spin Torque Nano Device with Tilted Polarizer," New Journal of Physics, 13 pages, 2009.
Lindner, "Current-Driven Magnetization Switching and Domain Wall Motion in Nanostructures—Survey of Recent Experiments," Superlattices and Microstructures, pp. 497-521, 2010.

(Continued)

*Primary Examiner* — Joseph Chang
*Assistant Examiner* — Jeffrey Shin
(74) *Attorney, Agent, or Firm* — Shumaker & Sieffert, P.A.

(57) ABSTRACT

A magnetic device is provided in one example that comprises a free layer having a magnetic anisotropy. The magnetic anisotropy is at least partially non-uniform. The magnetic device further comprises an antiferromagnetic layer adjacent to and weakly exchange coupled with the free layer, wherein the weak exchange coupling reduces the non-uniformity of the magnetic anisotropy of the free layer.

20 Claims, 4 Drawing Sheets

(56) References Cited

OTHER PUBLICATIONS

Finocchio et al., "Spin-Torque Driven Magnetic Vortex Self-Oscillations in Perpendicular Magnetic Fields," 13 pages, downloadable from, http://arxiv.org/ftp/arxiv/papers/1002/1002.2841.pdf, 2010.

Finnocchio et al., "Time Domain Study of Frequency-Power Correlation in Spin-Torque Oscillators," 14 pages, downloadable from, http://prb.aps.org/abstract/PRB/v81/i18/e184411, 2010.

Lehndorff et al., "Spin-Transfer Torque and Anisotropy in Fe/Ag/Fe Spin-Torque Oscillators," IEEE Transactions on Magnetics, 2 pages, 2008.

Gmitra et al, "Precessional Modes Due to Spin-Transfer in Spin-Valve Nanopillars," Materials Science—Poland, vol. 25, No. 2, pp. 571-576, 2007.

Houssameddine et al., "Spin-Torque Oscillator Using a Perpendicular Polarizer and a Planar Free Layer," Nature Materials, vol. 6, pp. 447-453, Jun. 2007.

Berkov et al., "Spin-Torque Driven Magnetization Dynamics: Micromagnetic Modeling," Journal of Magnetism and Magnetic Materials 320, pp. 1238-1259, 2008.

Kent et al., "Spin-Transfer-Induced Precessional Magnetization Reversal," Applied Physics Letters, vol. 84, No. 19, pp. 3897-3899, May 10, 2004.

Silva et al., "Theory of Thermally Induced Phase Noise in Spin Torque Oscillators for a High-Symmetry Case," IEEE Transactions on Magnetics, vol. 46, No. 9, pp. 3555-3573, Sep. 2010.

Zhou et al., "Capacitance Enhanced Synchronization of Pairs of Spin-Transfer Oscillators," IEEE Transactions on Magnetics, vol. 45, No. 6, pp. 2421-2423, Jun. 2009.

Extended European Search Report from counterpart EP Application No. 12160447.4, mailed Jun. 28, 2012, 6 pages.

Examination Report from counterpart EP Application No. 12 160 447.4, mailed Nov. 5, 2012, 5 pages.

Reply to communication from the Examining Division, for EP Application No. 12160447.4, dated Dec. 5, 2012, 19 pages.

\* cited by examiner

MAGNETIC DEVICE WITH WEAKLY EXCHANGE COUPLED ANTIFERROMAGNETIC LAYER

TECHNICAL FIELD

The disclosure relates to magnetic devices, such as magnetic devices that may be used in spin torque oscillators.

BACKGROUND

Some spin torque oscillators (STOs) may detect the presence and strength of a magnetic field due to changes in a magnetic oscillation of the STO that is induced in a free layer by a spin torque of the magnetic field.

SUMMARY

In one example, a magnetic device is provided that comprises a free layer having a magnetic anisotropy, wherein the magnetic anisotropy is at least partially non-uniform. The magnetic device further comprises an antiferromagnetic layer adjacent to and weakly exchange coupled with the free layer, wherein the weak exchange coupling reduces the non-uniformity of the magnetic anisotropy of the free layer.

In another example, a method for manufacturing a magnetic device is provided. The method may comprise forming a free layer having at least a partially non-uniform magnetic anisotropy and forming an antiferromagnetic layer adjacent to the free layer, wherein the antiferromagnetic layer reduces the non-uniformity of the magnetic anisotropy.

According to another example, a system is provided that comprises a circuit and a spin torque oscillator coupled to the circuit. The spin torque oscillator may comprise a free layer having at least a partially non-uniform magnetic anisotropy. The spin torque oscillator may further comprise at least one antiferromagnetic layer weakly exchange coupled to the free layer, wherein the weak exchange coupling causes the antiferromagnetic layer to reduce the non-uniformity of the magnetic anisotropy. A current may induce a magnetic field in the free layer, and the spin torque oscillator provides a signal related to the magnetic field to the circuit.

The details of one or more examples of the disclosure are set forth in the accompanying drawings and the description below. Other features, objects, and advantages of the disclosure will be apparent from the description and drawings, and from the claims.

BRIEF DESCRIPTION OF DRAWINGS

In accordance with common practice, the various described features are not drawn to scale and are drawn to emphasize features relevant to the present disclosure. Like reference characters denote like elements throughout the figures and text.

DETAILED DESCRIPTION

Figure 1:
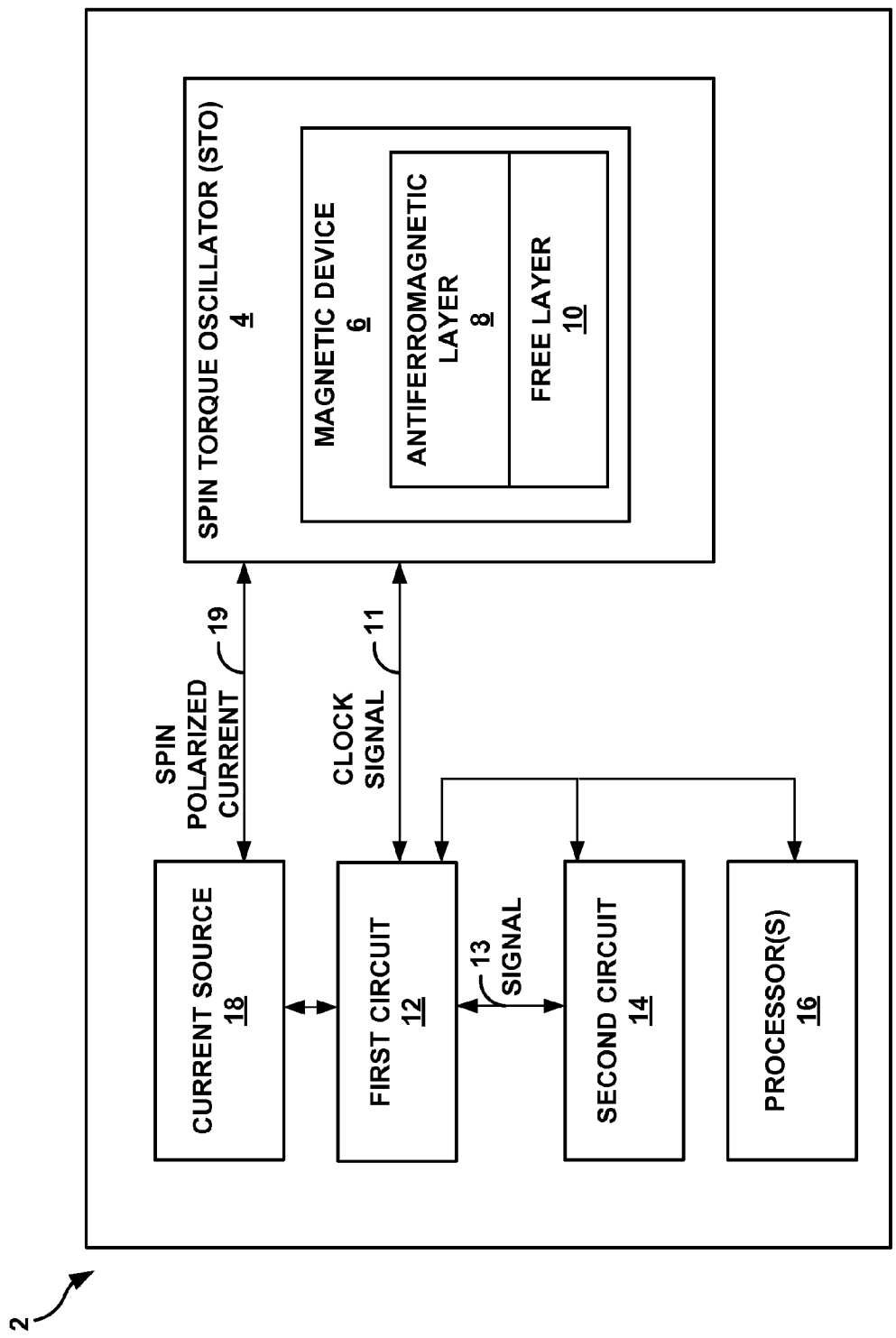
FIG. 1 is a block diagram illustrating one example of a device comprising a spin torque oscillator including a magnetic device comprising at least one antiferromagnetic layer weakly exchange coupled to a free layer.

In some magnetic devices, the introduction of current through the device causes magnetic moments in a free layer to reverse, such that the magnetization of the free layer oscillates. This reversal of magnetic moments may be referred to as spin precession. Spin precession of the free layer can generate power, which can be used for various purposes, such as to support relatively high bandwidth wireless communication. Uneven precession of the free layer can reduce the power output of the magnetic device. Example magnetic devices described herein include at least one antiferromagnetic layer that may help improve the uniformity of the precession of the free layer, which may help increase power output of the magnetic devices. The antiferromagnetic layer can be positioned adjacent to the free layer, such as above, below, or along an outer perimeter of the free layer, and, as described below, is weakly exchange coupled to the free layer. The presence of the antiferromagnetic layer can improve the uniformity of the magnetization of the free layer, which supports a more uniform precession. In this way, the antiferromagnetic layer may cause the spin precession of the free layer to be more even and steady compared to examples in which the magnetic device does not include the weakly exchange coupled antiferromagnetic layer.

Spin torque oscillators can be subject to errors, including timing jitter and phase noise with respect to induced and desired spin-precession response. These errors may result from edge pinning effects in the free layer of the STO. The timing jitter indicates cycle-to-cycle time lags and variability in the oscillation of the magnetization. This variability can degrade the desired oscillation performance and power transfer characteristics. These errors and non-uniformities may decrease the reliability and accuracy of the STO.

In addition to increasing the power output of the magnetic device, an improvement in the uniformity in the spin precession of the free layer can reduce phase noise. The phase noise may result from different atoms of the free layer rotating magnetic moments out of synch. For example, some atoms of the free layer may lead the rotation of magnetic moment, while other atoms may lag. The introduction of the at least one antiferromagnetic layer that is weakly exchange coupled to the free layer may help the atoms of the free layer rotate in synch, such that the rate of precession of the free layer is more constant. In addition, increasing the uniformity of spin precession of the free layer may also reduce timing jitter. In some examples, a reduction in timing jitter and phase noise may be achieved by defining the material structure and geometry of the magnetic device to support a single, dominant magnetization-reversal and precessional mode.

In some examples, the uniformity of precession of the free layer is improved through the definition of an easy-axis canting in the free layer. For example, a bias (easy-axis canting) is defined, for example, for an in-plane structure or for a perpendicular structure (e.g., a free layer) of the magnetic device. This easy-axis canting can help improve coherent precession and magnetization swing of the structure with more uniform anisotropy and weakly exchange coupling the free layer to an antiferromagnetic layer than in magnetic devices without an antiferromagnetic layer weakly exchange coupled to a free layer. In some examples, the magnetic device includes a circular, elliptical, or cylindrical geometry, which may reduce demagnetization. In addition, in some examples, the magnetic device includes a perimeter layer positioned around an outer perimeter of the device, which may help reduce pinning and coupling at the periphery of the device to reduce the likelihood or strength of secondary precession modes.

FIG. 1 is a block diagram illustrating one example of a system 2 comprising a spin torque oscillator (STO) 4 including a magnetic device 6 comprising at least one antiferromagnetic layer 8 weakly exchange coupled to a free layer 10.

System 2 may further include a first circuit 12, a second circuit 14, and one or more processors 16, and a current source 18. In some examples, system 2 may be one or more devices. Examples of system 2 may include any computing device (e.g., a desktop personal computer (PC), a mobile device, a tablet PC, and the like), a wireless device (e.g., a cell phone, radio, and the like), a satellite communications device, a radar device, as well as any other device or system where STO 4 may be utilized.

Spin torque oscillator 4 may detect the presence of a magnetic field via magnetic device 6. Magnetic device 6 may detect a magnetic field through a change in precessional oscillation frequency of a magnetization of free layer 10. In some examples, magnetic device 6 may be a magnetoresisitve sensor, including at least one of a giant magnetoresistive (GMR) device or a tunneling magnetoresistive (TMR) device. In other examples, magnetic device 6 may be any other type of magnetic device or sensor.

In one example, antiferromagnetic (AFM) layer 8 of magnetic device 6 is adjacent to free layer 10. As used herein, adjacent layers may refer to two layers at least partially, approximately physically contacting each other, such as directly adjacent to each other. AFM layer 8 may be composed of an antiferromagnetic material. Antiferromagnetic materials are materials in which the magnetic moments of atoms, ions, or molecules in the material tend to assume an ordered arrangement in the absence of an applied magnetic field. In some examples, antiferromagnetic layer 8 may be a weak antiferromagnetic layer.

In some examples, free layer 10 is composed of a material having low coercivity, such that free layer 10 may have an easily rotatable or moveable magnetic moment which responds to an external magnetic field (e.g., changes direction in the presence of). In some examples, free layer 10 may be composed of a ferromagnetic material having soft magnetization.

Free layer 10 may be a magnetic free layer having a magnetic anisotropy. A material with magnetic anisotropy may have magnetic properties that are directionally dependent. In one example, the magnetic anisotropy is approximately perpendicular to a biasing direction of free layer 10. A biasing direction may align a magnetic moment along a certain orientation. In other examples, the magnetic anisotropy of free layer 10 may be at another angle with respect to the biasing direction. In some examples, the magnetic anisotropy of free layer 10 is at least partially non-uniform. For example, there may be local variations in the magnetic anisotropy of free layer 10 due to the partially non-uniform magnetic anisotropy. In such an example, non-uniformity of the magnetic anisotropy may arise due to the proximity of other materials to free layer 10. For example, a pinned layer adjacent to free layer 10 may cause edge pinning effects in free layer 10, which can distort the magnetic anisotropy of free layer 10 along the surface proximate to the pinned layer.

In one example, antiferromagnetic layer 8 is weakly exchange coupled to free layer 10. Exchange coupling may result when a hard magnetization of an antiferromagnetic material causes a shift in a soft magnetization of a ferromagnetic material. For example, exchange coupling antiferromagnetic layer 8 to free layer 10 results in shifts in the magnetization of free layer 10 along an interface between antiferromagnetic layer 8 and free layer 10. In one example, weakly exchange coupling antiferromagnetic layer 8 to free layer 10 reduces non-uniformity of the anisotropy in free layer 10, such as by reducing the dispersion effects of the magnetization of free layer 10. The exchange coupling between antiferromagnetic layer 8 and free layer 10 is selected to be relatively weak, such that the anisotropy of free layer 10 is maintained. In another example, weakly exchange coupling antiferromagnetic layer 8 to free layer 10 improves the non-uniformity of the anisotropy in free layer 10. Any two layers described herein as being weakly exchange coupled are weakly exchange coupled similar to antiferromagnetic layer 8 and free layer 10.

A weak exchange bias due to the weak exchange coupling may be present at an interface between antiferromagnetic layer 8 and free layer 10. For example, non-uniformity of the magnetic anisotropy of free layer 10 may result in a hysteresis loop of free layer 10 having some local variations, non-linearity, or asymmetries. In such an example, the weak exchange coupling may reduce the non-uniformity of the magnetic anisotropy, resulting in a smoother hysteresis loop, without significantly shifting the hysteresis loop. In another example, the weak exchange bias may affect the magnetic anisotropy of free layer 10. In one example, the weak exchange coupling does not significantly reduce the effects of thermal energy on the anisotropy/or hysteresis switching of free layer 10. In another example, the weak exchange coupling does not induce magnetic anisotropy in free layer 10. In a further example, the weak exchange coupling between AFM layer 8 and free layer 10 may not substantially change the anisotropy of free layer 10. The antiferromagnetic properties of AFM layer 8 can be selected to achieve any of these results of the weak exchange coupling.

In one example, a hysteresis loop in a switching field of free layer 10 may not be significantly altered by the weak exchange coupling. In one example, the weak exchange coupling may shift an antiferromagnetic exchange field ($H_{ex}$) by anywhere between approximately −1 to 1 Oersted (Oe). In another example, the weak exchange coupling may shift $H_{ex}$ anywhere between approximately −5 to 5 Oe. In another example, the hysteresis loop is centered around approximately 0 Oe. In other examples, the hysteresis loop is centered around other magnetic field strength values. In one example, the weak exchange coupling between antiferromagnetic layer 8 and free layer 10 may not result in pinning any interfacial spins of free layer 10. In some examples, the canting angle may be as large as possible without switching the magnetization.

Current source 18 may provide a current to STO 4. Current source 18 may be a battery or any other current source. In one example, the current that is applied to magnetic device 6 is a spin polarized current 19. STO 4 detects magnetization induced by spin polarized current 19 by using magneto-resistance and magneto-resistive current effects. In one example, spin polarized current 19 is not spin polarized until the current from current source 18 is applied to a layer in magnetic device 6. In one example, spin polarized current 19 may drive a precession of a magnetization in free layer 10. The amount of spin polarized current 19 may be selected to compensate for any energy lost in the precession. In another example, the direction of spin polarized current 19 may be selected to influence the direction of the precession of the magnetization in the free layer 10.

The effects of weakly exchange coupling AFM layer 8 with free layer 10 results in improved precession of the magnetization of free layer 10 in the presence of spin polarized current 19, which can subsequently improve communications in such implementations. In one example, STO 4 may assist in chip-to-chip communications in system 2, for example, between first circuit 12 and second circuit 14. As used herein, "chip-to-chip" may refer to any implementation where a number of devices or components within a device are electrically coupled together. Examples of a device may include any circuit, such as first circuit 12 and second circuit 14, chip, memory, processor, micro-controller, video card, or the like. In some examples, system 2 employs at least one high rate device, for example, with an operating frequency measured in giga-Hertz (GHz) or higher.

STO 4 may be a local oscillator for first circuit 12. In one example, STO 4 may output a signal related to the detected magnetic field to first circuit 12. In one example, the signal related to the detected magnetic field is a clock signal 11. First circuit 12 may transfer a signal 13 to second circuit 14, where clock signal 11 is used as a carrier frequency for signal 13. In one example, the weak exchange coupling between antiferromagnetic layer 8 and free layer 10 improves the consistency and reliability of clock signal 11. In one example, clock signal 11 may have a narrow bandwidth, low jitter, and good phase noise properties. In some examples, clock signal 11 may have a bandwidth up to approximately 100 Megahertz (MHz). In one example, clock signal 11 has a bandwidth between approximately 100 kilohertz (kHz) to approximately 100 MHz. Using STO 4 for clocking may eliminate the need to have a local oscillator (LO) circuit coupled to first circuit 12.

In other examples, system 2 may include additional circuitry. For example, system 2 may include more than one spin torque oscillator 4. For example, system 2 can include a second STO that is coupled to second circuit 14 and used to decode the carrier frequency. In some examples, STO 4 is a spin torque nano-oscillatator (STnO). The example of system 2 shown in FIG. 1 is merely one example of a system that can include magnetic device 6 that includes AFM layer 8 weakly exchange coupled to free layer 10. For example, in another example of a system that includes magnetic device 6, current source 18 is located external to system 2.

Figure 2A:
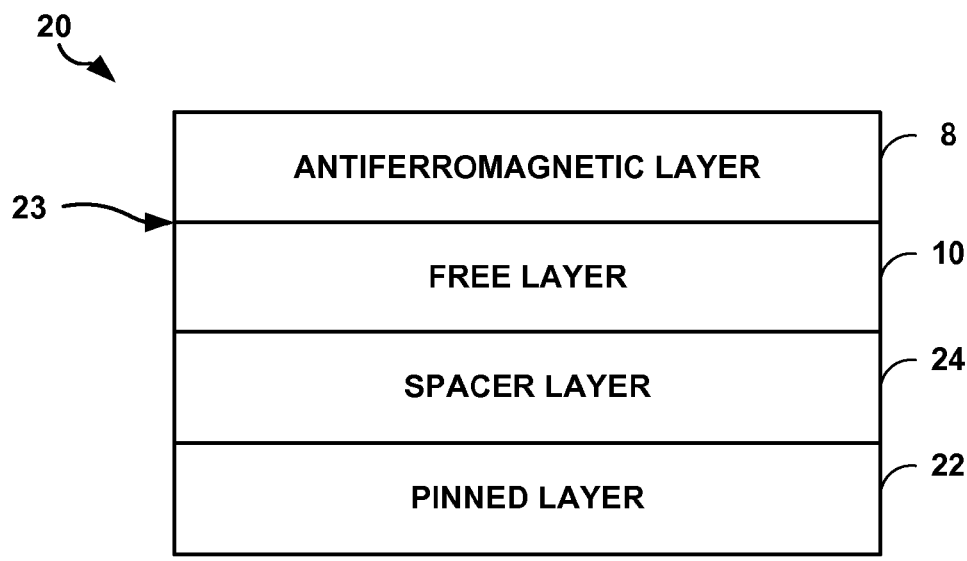
FIGS. 2A-2D are block diagrams illustrating example magnetic devices including at least one antiferromagnetic layer weakly exchange coupled to a free layer.

FIGS. 2A-2D are block diagrams illustrating example magnetic devices including at least one antiferromagnetic layer weakly exchange coupled to a free layer. Schematic cross-sectional views of the magnetic devices are depicted in FIGS. 2A-2D. The magnetic devices may have any suitable shape. FIG. 2A depicts one example of a magnetic device 20 which may comprise an antiferromagnetic layer 8 weakly exchange coupled to a free layer 10 along an interface 23 between layers 8, 10. Because antiferromagnetic layer 8 may be weakly exchange coupled to free layer 10, the magnetic anisotropy in free layer 10 is more uniform compared to magnetic devices that do not include an AFM layer 8 or an AFM layer 8 weakly exchange coupled to free layer 10. In one example, edge pinning effects on free layer 10 are reduced along interface 23 due to the weak exchange coupling with AFM layer 8. The reduction of the edge pinning effects on free layer 10 may enable free layer 10 to precess more freely, which may help increase the uniformity of the precession of free layer 10.

In one example, an easy-axis is defined which may be canted to support uniform magnetization and coherent reversal and precession for in-plane or perpendicular magnetization. In one example, a magnetization in free layer 10 is canted, either out of the plane or rotated in the plane of the free layer 10, or any angle between. In another example, a canted easy-axis may be defined in a pinned layer. In one example, the weak AFM coupling may be applied to any orientation of the magnetization.

In one example, free layer 10 may be a permalloy, that is, composed at least partially of nickel-iron (NiFe). For example, free layer 10 may be approximately 80% Ni and 20% Fe. Additional examples of free layer 10 may be composed of other NiFe compositions or of other suitable materials. In one example, free layer 10 may be approximately 1 to 5 nanometers (nm) thick. In other examples, free layer 10 may be other thicknesses.

Examples of antiferromagnetic layer 8 may be composed of manganese (Mn), platinum manganese (PtMn), iridium manganese (IrMn), nickel manganese (NiMn), iron manganese (FeMn), palladium platinum manganese (PdPtMn), or combinations thereof. In other examples, AFM layer 8 may be composed of other materials. In some examples, AFM layer 8 may be approximately 1 to 5 nm thick. In other examples, AFM layer 8 may be other thicknesses.

Magnetic device 20 may further comprise a pinned layer 22. Pinned layer 22 may be a reference layer having an approximately fixed magnetic moment. Examples of pinned layer 22 may be composed of at least one of nickel-iron (NiFe), nickel-iron alloys, iron cobalt (FeCo), nickel iron cobalt (NiFeCo), or combinations thereof. Other suitable materials can also be used for pinned layer 22. In some examples, the magnetization of free layer 10 is biased with respect to the fixed magnetic field of pinned layer 22. Magnetically biasing free layer 10 enables the magnetization of free layer 10 to precess due to spin torque oscillation. Pinned layer 22 can have a greater thickness than free layer 10 in some examples. In one example, pinned layer 22 may be approximately 1 to 20 nm thick, such as approximately 3 to 20 nm thick. In other examples, pinned layer 22 may be other thicknesses. In some examples, the thickness of pinned layer 22 may be selected for the strength of the switching field; a thicker pinned layer 22 leads to a greater switching field.

In the example of FIG. 2A, free layer 10 is located between antiferromagnetic layer 8 and pinned layer 22. That is, antiferromagnetic layer 8 may be located on a first side of free layer 10 and pinned layer 22 may be located on a second side of free layer 10 opposite the first side. In one example, antiferromagnetic layer 8 may be kept relatively far from pinned layer 22 within the magnetic device 20, e.g., relative to free layer 10, in order to help reduce the possibility that antiferromagnetic layer 8 will be coupled to pinned layer 22. In one example, the fixed magnetic moment of pinned layer 22 is further stabilized by another antiferromagnetic layer.

In some examples, magnetic device 20 may also comprise a spacer layer 24 formed over the pinned layer 22. One example of spacer layer 24 may be a non-magnetic spacer layer. One example of a non-magnetic spacer layer 24 may be an electrically conductive spacer layer when magnetic system 20 is a giant magnetoresistive (GMR) sensor. As another example, spacer layer 24 may be a non-magnetic, electrically insulating barrier layer when the source of magnetoresistance of magnetic system 20 is based on a tunneling magnetoresistive (TMR) effect. In one example, spacer layer 24 may be approximately 1 nm thick. In other examples, spacer layer 24 may be other thicknesses.

Figure 2B:
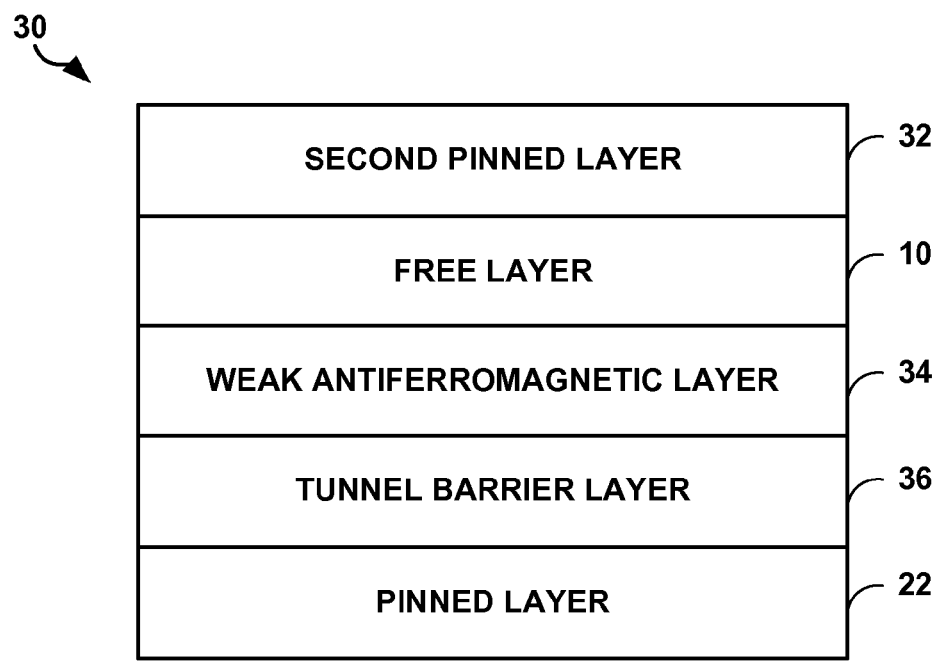

FIG. 2B depicts one example of a tunneling magnetoresistive (TMR) device 30. TMR device 30 may comprise a tunnel barrier layer 36 and an antiferromagnetic layer 8 weakly exchange coupled to a free layer 10. TMR device 30 may further include a second pinned layer 32 in addition to pinned layer 22. Tunnel barrier layer 36 may provide TMR functionality to TMR device 30. In one example, tunnel barrier layer 36 may be one of aluminum oxide (AlOx) or magnesium oxide (MgOx), or any other suitable material.

In one example, pinned layer 22 and second pinned layer 32 may have opposite magnetization and are placed on opposite sides of free layer 10 to supply spin-polarized currents of the desired polarity. The inclusion of two pinned layers having substantially opposite magnetization can help control the precession direction of free layer 10. In some examples, pinned layer 22 and second pinned layer 32 may be located either adjacent to or some distance from the TMR device 30.

Figure 2C:
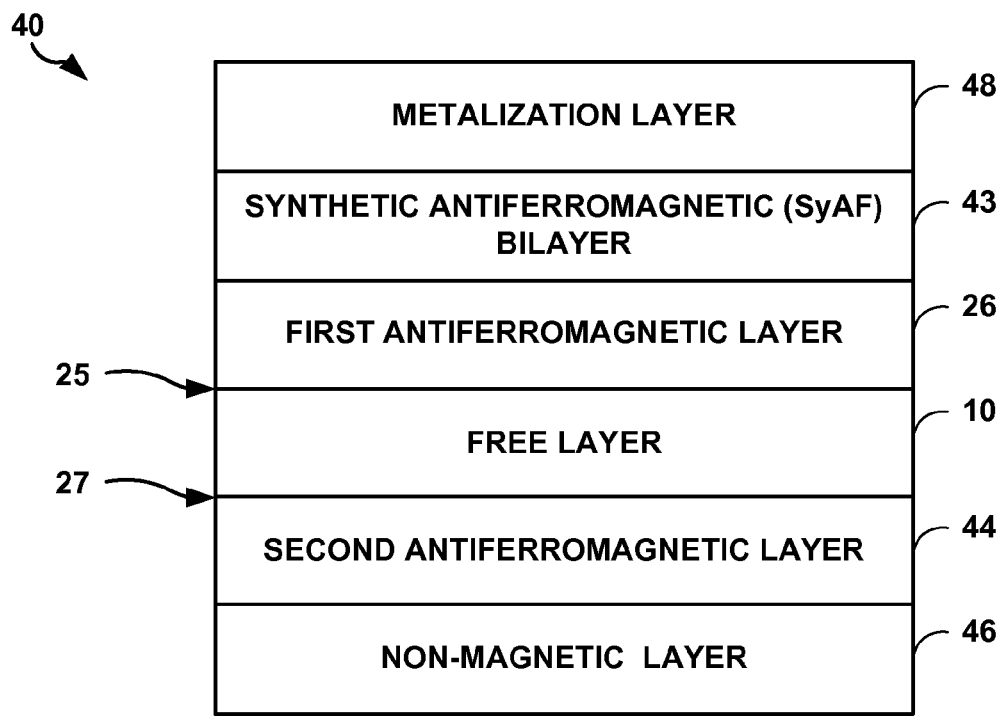

FIG. 2C is a block diagram of one example of a giant magnetoresistive (GMR) device 40. In this example, GMR device 40 may have a first antiferromagnetic layer 26 and a second antiferromagnetic layer 44. First antiferromagnetic layer 26 may be weakly exchange coupled to a first side 25 of free layer 10. Second antiferromagnetic layer 44 may be weakly exchange coupled to a second side 27 of free layer 10. In this example, first side 25 is opposite second side 27. Both antiferromagnetic layers 26 and 44 improve the uniformity of the magnetic anisotropy of free layer 10. Positioning an AFM layer 26 or 44 on the top or bottom of free layer 10 results in exchange coupling through horizontal surfaces 25 or 27, respectively. The addition of weak AFM exchange coupled layers 26 and 44 to free layer 10 may reduce dispersion effects to the magnetization of free layer 10. Because spins are throughout free layer 10, including along sides 25 and 27, any precession may be influenced by defects in the spins along the sides of free layer 10. Having an antiferromagnetic layer 26 or 44 on both sides 25 and 27 of free layer 10 further regulates the precession to improve its uniformity.

GMR device 40 may include a non-magnetic layer 46 as a spacer layer. In some examples, non-magnetic layer 46 may be made of copper (Cu), or the like. Another example of non-magnetic layer 46 may be a non-magnetic, electrically insulating barrier layer. Non-magnetic layer 46 may provide giant magnetoresistive functionality to GMR device 40.

GMR device 40 may also include a synthetic antiferromagnetic (SyAF) bilayer 43 as a pinned layer. In one example, a current is applied to SyAF bilayer 43. In one example, the current in SyAF bilayer 43 is spin polarized. GMR device 40 may further include a metalization layer 48 that may be a capping layer formed over the sensor stack of GMR device 40. One example of metallization layer 48 may be tantalum (Ta), although any material suitable for capping may be used.

Figure 2D:
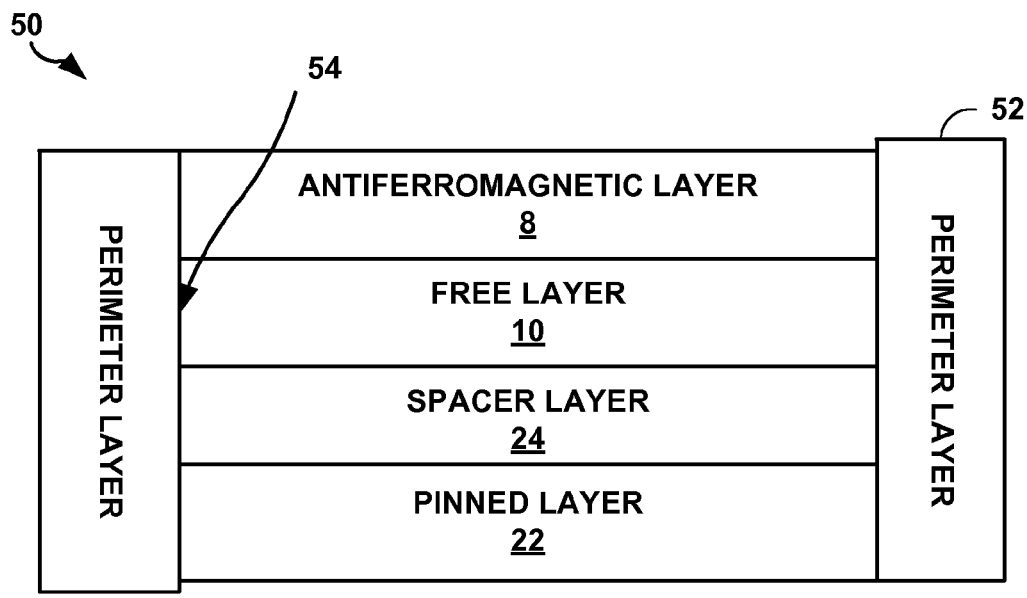

FIG. 2D is a block diagram of an example of a magnetic sensor 50. As described herein, magnetic sensor 50 has the same structure as magnetic device 20 (FIG. 2A), with the addition of a perimeter layer 52. Perimeter layer 52 is positioned adjacent to at least one of free layer 10 or pinned layer 22 to suppress edge pinning effects. In the example shown in FIG. 2D, perimeter layer 52 is formed at least partially along an outer perimeter 54 of free layer 10. In examples in which magnetic sensor 50 is shaped as an elliptical or circular device, layers 8, 10, 22, and 24 may be layers having an approximately elliptical or circular cross-sectional shape in a plane that is substantially perpendicular to the plane of the image shown in FIG. 2D. Perimeter layer 52 may be formed around some or all of layers 8, 10, 22, and 24. In one example, perimeter layer 52 is formed only around the outer perimeter 54 of free layer 10. Perimeter layer 52 further improves the uniformity of precession of a magnetization of free layer 10.

In one example, perimeter layer 52 may be an antiferromagnetic material. AFM perimeter layer 52 may be weakly exchanged coupled to at least free layer 10. In such an example, AFM perimeter layer 52 reduces edge pinning effects along perimeter 54 of free layer 10.

In another example, perimeter layer 52 may be a soft layer. A soft perimeter layer 52 may be a material that is highly permeable. When the magnetization of free layer 10 is canted, the magnetization may be influenced by magnetic poles forming on the edge(s) of free layer 10 as the magnetization precesses. The magnetic poles along perimeter 54 of free layer 10 can cause a non-uniform demagnetization field. Soft perimeter layer 52 may draw in any magnetization from these surface poles because of the permeability of the soft layer. Likewise, soft perimeter layer 52 may not emit a stray magnetic field. This may allow material properties to dominate the precession of the magnetization so it is more uniform.

In another example, perimeter layer 52 may be a decoupling or non-pinning layer. The decoupling or non-pinning layer may make the stoichiometry (chemical composition) of materials in contact with it more uniform. For example, during deposition, the composition of the deposited materials may differ between the edges and the bulk of the material. The decoupling or non-pinning layer can improve the uniformity of these layers by homogenizing the chemical composition of the material. For example, decoupling or non-pinning layer perimeter layer 52 may homogenize the stoichiometry of free layer 10 along perimeter 54.

Any of the layers as described herein with respect to FIGS. 2A-2D (such as pinned layer 22, for example) may be a single layer or a structure of more than one layer or partial layers. Furthermore, any of the layers or features described in any of the examples of FIGS. 2A-2D may be combined with each other for additional examples. Magnetic devices 20, 30, 40, or 50 may also have additional layers or structures. For example, any of magnetic devices 20, 30, 40, or 50 may include a magnetic shield layer. In such an example, a magnetic shield layer may be an electrically conductive, magnetic material, such as nickel-iron (NiFe). In further examples, the layers of the devices 20, 30, 40, and 50 may be any type of structure, for example, polycrystalline, monocrystalline, amorphous, or the like.

Figure 3:
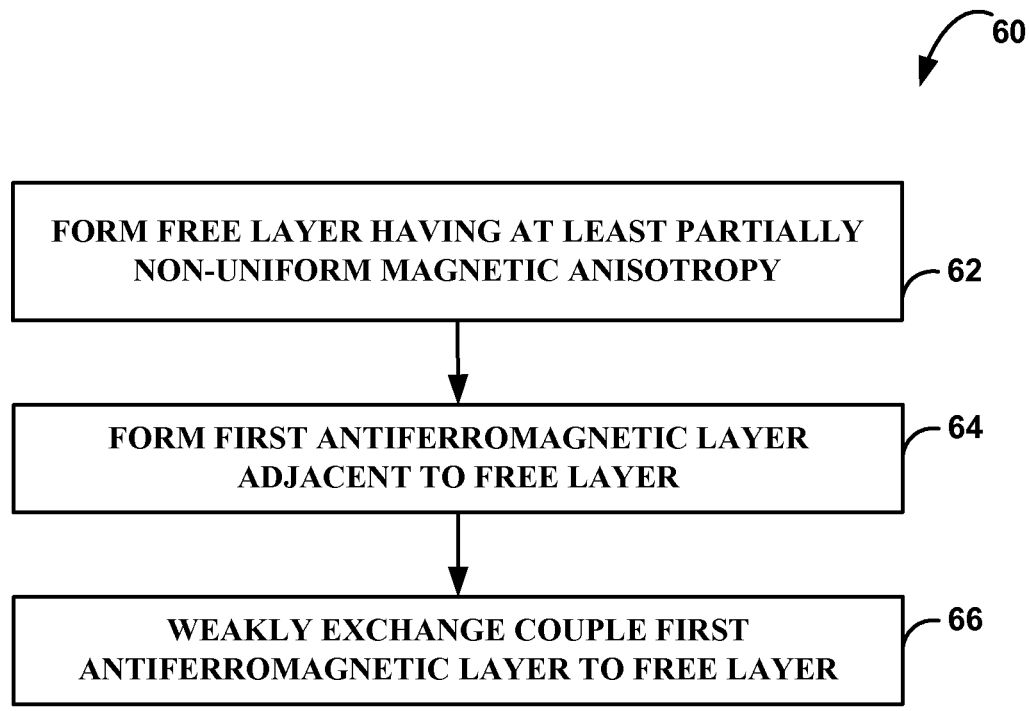
FIG. 3 is a flowchart illustrating an example method for manufacturing a magnetic device including at least one antiferromagnetic layer weakly exchange coupled to a free layer.

FIG. 3 is a flowchart illustrating an example method 60 for manufacturing a magnetic device comprising at least one antiferromagnetic layer weakly exchange coupled to a free layer. Method 60 may include forming a free layer (e.g., free layer 10) having at least partially non-uniform magnetic anisotropy (62). Method 60 may further include forming a first antiferromagnetic layer (e.g., antiferromagnetic layer 8, antiferromagnetic layer 26, antiferromagnetic layer 34, or antiferromagnetic layer 44) adjacent to the free layer (64). In such an example, the first AFM layer may reduce the at least partially non-uniformity of the magnetic anisotropy of the free layer.

Method 60 may further include weakly exchange coupling the first AFM layer to the free layer (66). In some examples, the first AFM layer may be weakly exchange coupled to the free layer based on the material properties of at least the first AFM layer, such that upon forming the first AFM layer adjacent to the free layer, the first AFM layer is weakly exchange coupled to the free layer. In other examples, the first AFM layer may be weakly exchange coupled to the free layer through performing a thermal anneal after deposition of the AFM layer. The temperature or duration of the thermal anneal may be selected to achieve a desired strength of the exchange coupling. Some examples of the temperature and duration of the thermal anneal may be between from approximately 100 to approximately 500 degrees Celsius (° C.) and the duration may be approximately 0.1 hours to 5 hours. In one example, the thermal anneal is performed for approximately 1 hour at approximately 250° C. In other examples, alterations to the deposition process or configuration of the magnetic device may be made in order to achieve a weak exchange coupling of a desired strength.

In one example, method 60 may include forming a second antiferromagnetic layer adjacent to the free layer, wherein the second antiferromagnetic layer is located on a side of the free layer opposite the first antiferromagnetic layer. In other examples, method 60 may further include forming a perimeter layer at least partially around the free layer, wherein the perimeter layer further reduces the non-uniformity of the magnetic anisotropy of the free layer. In yet another example, method 60 may include forming a pinned layer, wherein the free layer is located between first antiferromagnetic layer and the pinned layer.

Any method of deposition or fabrication now known or later developed may be used to implement method 60. For example, magnetic sputtering or molecular beam epitaxy (MBE) may be used to deposit the layers. Chemical or physical deposition methods may be used. In some examples, thin film deposition techniques are used to perform method 60.

Some existing spin torque oscillators are subject to timing jitter, phase noise, and sub-optimal or sub-maximum precession. Weakly exchange coupling an antiferromagnetic layer to a free layer reduces these effects and allows precession to be more uniform. In one example, the precession of magnetization in the free layer is increased. In another example, edge pinning effects are reduced by weakly exchange coupling one or more antiferromagnetic layers to the free layer. In one example, the weak AFM exchange coupling reduces noise effects due to temperature variation of magnetic device 6.

Examples of the present disclosure may reduce the power needed to run system 2. Further examples of the present disclosure may reduce the overall size of system 2 by increasing the power that is output by magnetic device 6. A magnetic device, according to examples of the present disclosure, may provide a higher frequency broad-frequency range tunable oscillator with low jitter, low phase noise, and high output power.

In the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "about," "approximate," or the like indicates that the value listed may be somewhat altered, as long as the alteration does not result in nonconformance of the process or structure to the illustrated example.

Terms of relative position as used in this disclosure are defined based on a plane parallel to the conventional plane or working surface of a wafer or substrate, regardless of the orientation of the wafer or substrate. The term "horizontal" or "lateral" as used in this disclosure is defined as a plane parallel to the conventional plane or working surface of a wafer or substrate, regardless of the orientation of the wafer or substrate. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the wafer or substrate, regardless of the orientation of the wafer or substrate.

Various aspects of the disclosure have been described. Aspects or features of examples described herein may be combined with any other aspect or feature described in another example. These and other examples are within the scope of the following claims.

The invention claimed is:

1. A system comprising:
a spin torque oscillator comprising a magnetic device, the magnetic device comprising:
a stack comprising a plurality of layers including a free layer having a magnetic anisotropy, wherein the magnetic anisotropy is at least partially non-uniform; and
an antiferromagnetic layer formed at least partially around an outer perimeter of the stack and adjacent to the free layer and at least one other layer of the plurality of layers of the stack, wherein the antiferromagnetic layer is weakly exchange coupled with the free layer, and wherein the weak exchange coupling of the antiferromagnetic layer reduces the non-uniformity of the magnetic anisotropy of the free layer.

2. The system of claim 1, wherein the antiferromagnetic layer comprises a first antiferromagnetic layer, the stack further comprising:
a second antiferromagnetic layer adjacent to and weakly exchanged coupled with the free layer, wherein the weak exchange coupling of the second antiferromagnetic layer further reduces the non-uniformity of the magnetic anisotropy of the free layer.

3. The system of claim 2, wherein the second antiferromagnetic layer is formed on a first side of the free layer, the stack further comprising:
a third antiferromagnetic layer adjacent to and weakly exchanged coupled with the free layer, wherein the weak exchange coupling of the third antiferromagnetic layer further reduces the non-uniformity of the magnetic anisotropy of the free layer, and wherein the third antiferromagnetic layer is formed on a second side of the free layer opposite the first side.

4. The system of claim 2, further comprising:
a pinned layer formed on a first side of the free layer, wherein the second antiferromagnetic layer is on a second side of the free layer opposite the first side.

5. The system of claim 2, wherein the stack defines a first edge and a second edge separated from the first edge in a first direction, the outer perimeter of the stack being defined at least in part by the first and second edges, and wherein the free layer and the second antiferromagnetic layer are stacked in a second direction that is substantially perpendicular to the first direction.

6. The system of claim 1, further comprising:
a soft layer formed at least partially around an outer perimeter of the free layer, wherein the soft layer further reduces the non-uniformity of the magnetic anisotropy of the free layer.

7. The system of claim 1, further comprising:
a decoupling layer formed at least partially around the outer perimeter of the stack and adjacent to the free layer, wherein the decoupling layer further reduces the non-uniformity of the magnetic anisotropy of the free layer.

8. The system of claim 1, wherein the antiferromagnetic layer comprises at least one of manganese (Mn), platinum manganese (PtMn), iridium manganese (IrMn), nickel manganese (NiMn), iron manganese (FeMn), palladium platinum manganese (PdPtMn), or combinations thereof.

9. The system of claim 1, further comprising:
a synthetic antiferromagnetic (SyAF) bilayer formed over the free layer, wherein a spin polarized current applied to the SyAF bilayer induces a magnetization in the free layer, wherein the magnetization processes at an approximately uniform rate.

10. The system of claim 1, wherein the free layer has a magnetization, wherein a direction of the magnetization is one of in a plane of the free layer, perpendicular to the plane of the free layer, or canted at any angle between in the plane and perpendicular to the plane.

11. The system of claim 1, wherein the magnetic device comprises at least one of a giant magnetoresistive (GMR) device or a tunneling magnetoresistive (TMR) device.

12. A method for manufacturing a magnetic device of a spin torque oscillator, the method comprising:

forming a stack comprising a plurality of layers including a free layer having at least a partially non-uniform magnetic anisotropy; and forming an antiferromagnetic layer at least partially around an outer perimeter of the stack and adjacent to the free layer and at least one other layer of the plurality of layers of the stack, wherein the antiferromagnetic layer reduces the non-uniformity of the magnetic anisotropy.

13. The method of claim 12, wherein forming the antiferromagnetic layer comprises weakly exchange coupling the antiferromagnetic layer to the free layer, wherein the weak exchange coupling causes the antiferromagnetic layer to reduce the non-uniformity of the magnetic anisotropy.

14. The method of claim 13, wherein weakly exchange coupling comprises performing a thermal anneal on the antiferromagnetic layer.

15. The method of claim 12, wherein the antiferromagnetic layer comprises a first antiferromagnetic layer, and forming the stack further comprises:

forming a second antiferromagnetic layer adjacent to the free layer, wherein the second antiferromagnetic layer is weakly exchange coupled with the free layer and wherein the weak exchange coupling further reduces the non-uniformity of the magnetic anisotropy.

16. The method of claim 15, wherein forming the stack further comprises:

forming a third antiferromagnetic layer adjacent to the free layer and on a side of the free layer opposite the second antiferromagnetic layer, wherein the third antiferromagnetic layer further reduces the non-uniformity of the magnetic anisotropy of the free layer.

17. The method of claim 15, wherein forming the stack further comprises:

forming a pinned layer, wherein the free layer is located between the second antiferromagnetic layer and the pinned layer.

18. A system comprising:

a circuit;

a spin torque oscillator coupled to the circuit, the spin torque oscillator comprising:

a stack comprising a plurality of layers including a free layer having at least a partially non-uniform magnetic anisotropy; and an antiferromagnetic layer formed at least partially around an outer perimeter of the stack and adjacent to the free layer and at least one other layer of the plurality of layers of the stack, wherein the antiferromagnetic layer is weakly exchange coupled to the free layer, wherein the weak exchange coupling causes the antiferromagnetic layer to reduce the non-uniformity of the magnetic anisotropy;

wherein a current induces a magnetic field in the free layer, and wherein the spin torque oscillator provides a signal to the circuit, wherein the signal is related to the magnetic field.

19. The system of claim 18, wherein the antiferromagnetic layer is a first antiferromagnetic layer, and the stack further comprises:

a second antiferromagnetic layer weakly exchange coupled to the free layer.

20. The system of claim 18, wherein the circuit comprises a first circuit, wherein the signal related to the magnetic field is a clock signal, and wherein the first circuit uses the clock signal as a carrier frequency in a signal transfer to a second circuit.

* * * * *